United States Patent [19]

Campbell et al.

[11] 4,357,492

[45] Nov. 2, 1982

[54] AUTOMATIC MICROPHONE MIXING APPARATUS

[76] Inventors: Eugene Campbell, 7101 W. Yale, #704, Denver, Colo. 80227; Terrance R. Whittemore, 7217 S. Independence, Littleton, Colo. 80123

[21] Appl. No.: 193,730

[22] Filed: Oct. 3, 1980

[51] Int. Cl.³ .............................................. H04R 27/00
[52] U.S. Cl. ................................ 179/1 AT; 179/1 VL
[58] Field of Search ................. 179/1 B, 1 AT, 1 CN, 179/1 VC, 1 HF, 1 VL

[56] References Cited

U.S. PATENT DOCUMENTS 3,992,584  11/1976  Dugan ............................. 179/1 AT
4,149,032  4/1979  Peters ............................. 179/1 CN

*Primary Examiner*—Joseph A. Popek
*Attorney, Agent, or Firm*—Sheridan, Ross & McIntosh

[57] ABSTRACT

A sound reinforcement apparatus is provided for combining a number of individually generated audio signals and outputting a collective audio signal representative of the sum of the individual audio signals. The apparatus includes a plurality of volume regulating circuits. Each volume regulating circuit communicates with a microphone which outputs one of the audio signals. Each microphone receives the sound produced by one vocalist or instrumentalist. Each of the volume regulating circuits outputs a modified audio signal having a fixed, predetermined level. A volume control signal is also outputted by each of the volume regulating circuits. The volume control signals are sent to a volume summing circuit which outputs a volume control restoring signal. The audio signals are applied to an audio sum circuit which outputs an audio sum signal. After the individual audio signals have been summed together in the audio sum circuit, the dynamics of the audio signals altered in the volume regulating circuits is restored in the audio sum signal by means of the volume control restoring signal so that a quality and pleasing sound is produced which is not dominated by any one instrumentalist or vocalist.

18 Claims, 4 Drawing Figures

Fig_1

AUTOMATIC MICROPHONE MIXING APPARATUS

FIELD OF THE INVENTION

The present invention relates to an apparatus for mixing voices and/or musical instrument sounds and, more particularly, to an apparatus which combines signals produced by a number of voices and musical instruments after the amplitudes of each of these signals have been set to a predetermined magnitude.

BACKGROUND ART

Various sound processing and recording devices and techniques have been devised to provide a high quality, amplified output sound. A number of these devices are directed to minimizing the effects of noise which accompany the intelligible sound. In U.S. Pat. No. Re. 28,426 Dolby, signal compressor and expander circuits are described for reducing noise in a tape recorder system. The compressor circuit includes a variable frequency filter wherein the pass band is adjustable depending upon the output amplitude of the signal passed by the filter. As the amplitude of the signal passed by the filter increases, the cut-off frequency is automatically shifted more adjacent the relevant extreme of the signal band. In U.S. Pat. No. 3,789,143 to Blackmer, a compander system is provided for improving the dynamic range of a recording system. The compander is characterized by a converter which produces a signal for controlling the amplitude of an output audio signal. The control signal is a function of the RMS amplitude of an input audio signal. In U.S. Pat. No. 4,162,457 to Grodinsky, an expander circuit is disclosed for improving the dynamic qualities of the recorded signal in a two channel amplifying system. A coupling circuit interconnects the two channels. The effective coupling between the channels is dictated by the difference in amplitude of the signals from the two channel signal sources.

The present invention is directed to a sound mixing device fitted to the specialized needs of mixing audio signals produced by a relatively large number of vocalists and instrumental musicians. There are inherent difficulties in attempting to provide a high quality sound when combining an orchestra sound with that of a vocalist group. Achieving a proper balance among the various sounds produced can be an almost insurmountable task. The actual projection of brass instruments can easily mask the intelligible portion of the frequency spectrum of vocal music thereby resulting in a misunderstanding of the words sung by the vocalists. Live performances by orchestras in facilities not acoustically appropriate for orchestra sound production and the generation of nonprofessional instrumental sounds can readily cause problems in the balancing of the sound levels of the individual instruments. In addition to live performances, similar difficulties arise in connection with the recording of vocalist groups and/or instrumental musicians. This result is particularly evident when the recording of a live performance is made. A recording studio is normally designed to obviate these problems. However, the recording studio frequently does not have the capability for handling large numbers of vocalists or instrumentalists. The foregoing problems can be solved by utilizing an acoustically proper auditorium capable of housing a great number of vocalists and instrumentalists. But this solution is often unworkable since it is often difficult to provide an esthetically pleasing as well as the desired acoustical surroundings. In this light, the automatic microphone mixing apparatus combines a large number of vocalists and instrumental produced sounds without undue concern to the acoustical character of the building in which the vocalists and instrumentalists perform. Generally, the present invention is a sound reinforcement system which includes a plurality of microphones. Each microphone communicates with a volume regulating circuit having a reference level circuit. The reference level circuit outputs a reference level signal utilized in the suppressing or enhancing of audio signals. The level of each audio signal is preset to a fixed, predetermined magnitude, depending upon the magnitude of the reference level signal. Unlike previous sound mixing devices in which the level of the audio signal is variable, the present invention sets or fixes each audio signal from each of the various instrumentalists and vocalists to the same, predetermined level and then mixes these audio signals. As a result, there is no dominant instrument or vocalist sound generated.

SUMMARY OF THE INVENTION

In accordance with the present invention, an automatic sound mixing apparatus is provided for use with a relatively large number of vocalists and instrumentalists. The apparatus includes a plurality of volume regulating circuits. Each volume regulating circuit responds to the output of a microphone. Each microphone receives one of the plurality of sounds produced by the vocalists or instrumentalists. Each volume regulating circuit includes a reference level circuit which outputs a reference level signal having a predetermined magnitude. The reference level signal is provided to assist in the setting of an audio signal from a microphone to a fixed level or amplitude. The modified in volume audio signals outputted from each of the volume regulating circuits is inputted to an audio sum circuit. The audio sum circuit combines all of the modified in volume audio signals. Each volume regulating circuit also generates a volume control signal utilizing the reference level signal. The volume control signal from each of the volume regulating circuits is inputted to a volume summing circuit. The volume summing circuit outputs a volume control restoring signal. The volume dynamics of the instrumental and vocal sounds altered in the volume regulating circuits are collectively restored in a volume dynamics restoring circuit. This circuit outputs a volume restored audio signal representative of the combined audio signals. The volume dynamics restoring circuit uses the volume control restoring signal to control the level or amplitude of the volume restored audio signal thereby restoring the volume dynamics.

More particularly, the automatic microphone mixing apparatus includes a number of microphone pre-amplifier circuits. Each microphone pre-amplifier circuit communicates with a microphone. Each vocalist and/or instrumentalist has a microphone so that one microphone receives the sound produced by one vocalist or instrumentalist. Each microphone pre-amplifier circuit amplifies the audio signal received from the microphone connected thereto. Each of the amplified audio signals is sent to a volume regulating circuit. Each volume regulating circuit includes a voltage controlled amplifier through which an audio signal is sent. A modified volume audio signal is outputted by the voltage controlled amplifier. The level of the modified volume audio signal is dependent upon the magnitude of a volume control signal. The volume control signal is generated by combining a reference level signal with a rectified signal in the volume regulating circuit. The magnitude of the reference level signal is fixed. Consequently, the level of the modified volume audio signal outputted by the voltage controlled amplifier is also of a predetermined magnitude. The modified volume audio signals outputted by each of the volume regulating circuits are applied to a summing circuit to provide an audio sum signal. The volume control signals outputted by each of the volume regulating circuits are combined in a volume summing circuit. The output of the volume summing circuit is a volume control restoring signal, the amplitude of which is a function of the amplitudes of the individual volume control signals. The audio sum signal and the volume control restoring signal are transmitted to a volume dynamics restoring circuit. The audio sum signal is modified by the volume control restoring signal thereby restoring the relative volume dynamics to the audio sum signal. A volume restored audio signal is then outputted by the volume dynamics restoring circuit and sent to a balanced line driver circuit. The balanced line driver circuit feeds appropriate power amplifiers which communicate with speaker units.

In view of the foregoing description, a number of salient objectives of the present invention are achieved. An automatic sound mixing apparatus is provided for particular use with a large number of vocalists and instrumentalists. This mixing apparatus virtually eliminates the requirement of a proper acoustical setting while still outputting a quality and pleasing sound. The mixing apparatus adjusts each individual audio signal inputted thereto and outputs an audio signal which includes the combined audio signals without altering their collective volume dynamics. The volume dynamics of each audio signal is initially modified using a reference level signal having a predetermined magnitude. As a consequence, the mixing apparatus can boost relatively weak sounds and suppress relatively strong sounds. The combined vocalist and instrumentalist sound produced has no dominating sound, which can be a desirable result in musical back-up groups or in a choir. Additional benefits of the present invention will become readily apparent from the following description taken in conjunction with the accompanying drawings.

DESCRIPTION OF THE PREFERRED EMBODIMENT

Figure 1:
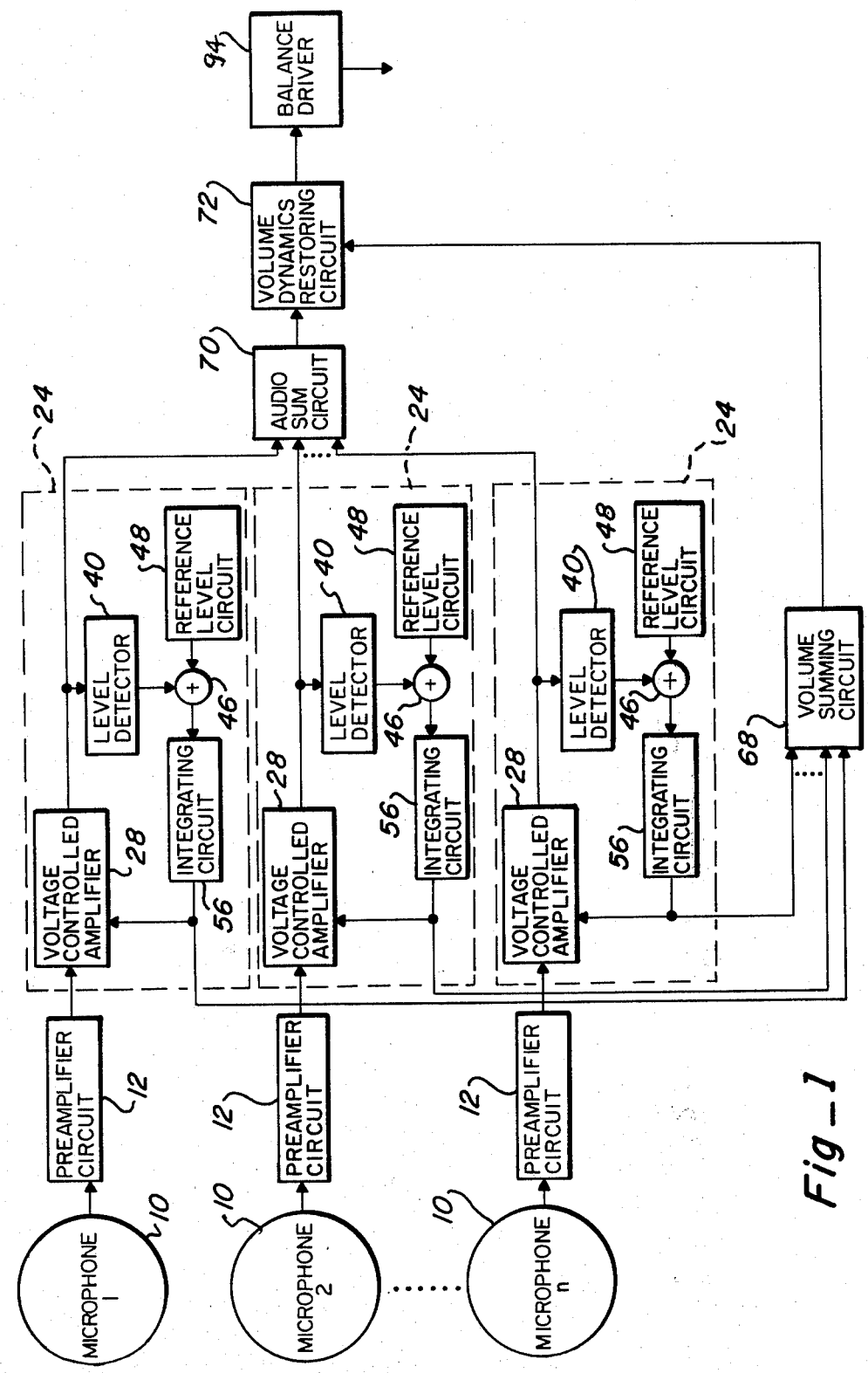
FIG. 1 is a block diagram of the automatic sound mixing apparatus.
Figure 2:
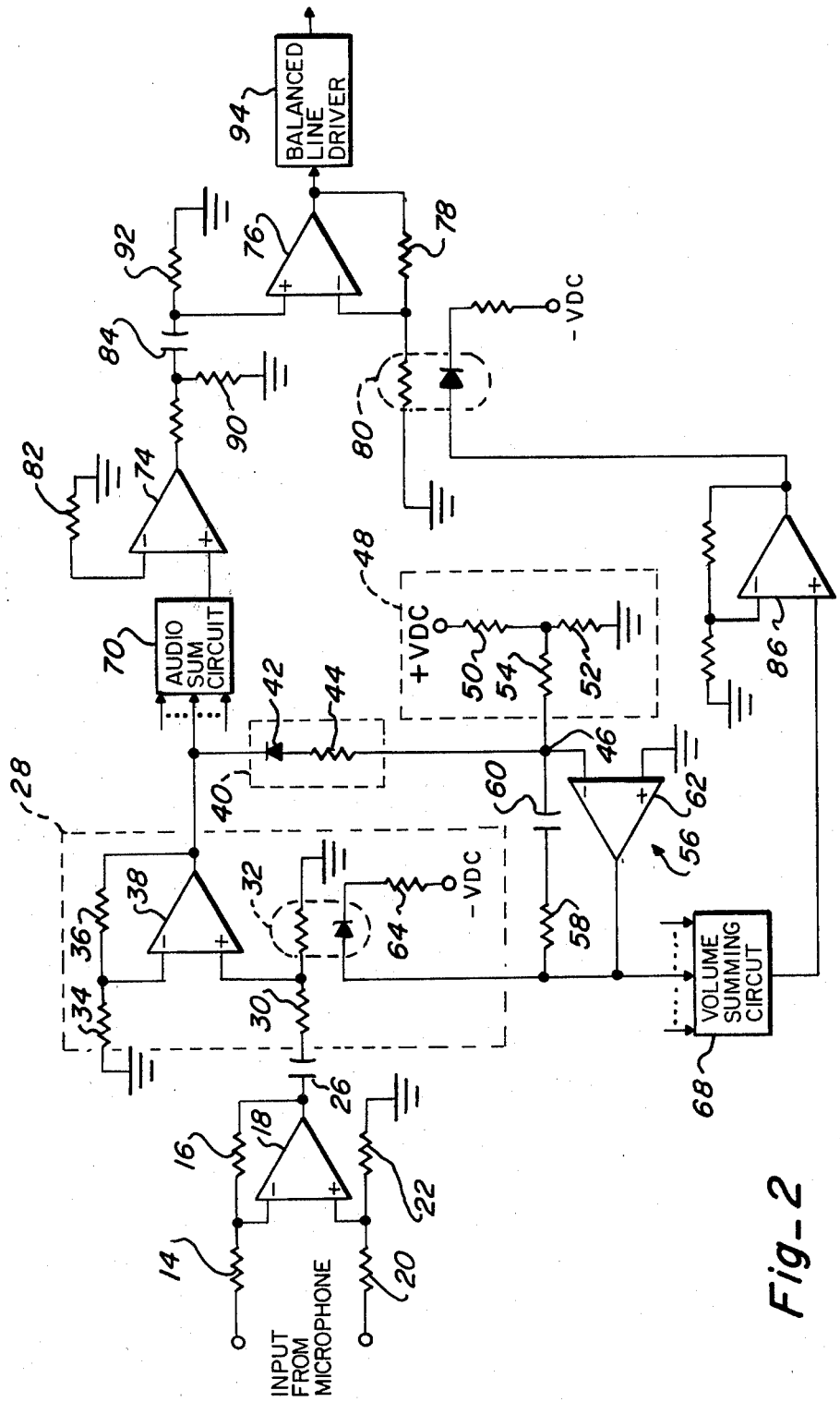
FIG. 2 is an electrical schematic showing further details of the sound mixing apparatus.

In accordance with the present invention, an automatic sound mixing apparatus is provided which includes a number of microphones 10. A microphone is available for use by each vocalist or instrumentalist which together comprise a large musical group. The mixing apparatus is intended to be used by a group of at least thirty-two vocalists and/or instrumentalists, although any number can be accommodated. As illustrated in FIG. 1, the number of microphones 10 provided is n. Each microphone 10 outputs an audio signal which is applied to a pre-amplifier circuit 12. Each of the pre-amplifier circuits 12 is of identical configuration and a representative pre-amplifier circuit 12 is shown in FIG. 2. The pre-amplifier circuit 12 includes interconnected resistors 14, 16 joined to the inverting side of operational amplifier 18 while interconnected resistors 20, 22 are joined to the non-inverting side of operational amplifier 18. Operational amplifier 18 acts as a differential amplifier outputting an audio signal increased in gain by +46 db.

The output of each pre-amplifier circuit 12 is applied to a volume regulating circuit 24. Again, there is a volume regulating circuit 24 for each microphone 10 and pre-amplifier circuit 12. Since the volume regulating circuits 24 are identical, a representative volume regulating circuit 24 can be described. As seen in FIG. 2, the audio signal from the pre-amplifier circuit 12 is sent through a capacitor 26. Capacitor 26 removes any DC offset in the pre-amplifier circuit 12 output. The output of capacitor 26 is applied to voltage controlled amplifier (VCA) 28. Resistor 30 and photoresistor 32 of VCA 28, together with capacitor 26, form a high pass filter. The high pass filter prevents passage of very low frequency components through the voltage control amplifier 28. Resistors 34, 36 are joined to the inverting side of operational amplifier 38 and together therewith provide a fixed gain of +20 db. The output of operational amplifier 38 is rectified in the level detector 40 by diode 42. Resistor 44 of level detector 40 generates a current for application through summing junction 46. Summing junction 46 also receives a current supplied by reference level circuit 48. Reference level circuit 48 includes resistors 50, 52, 54. Resistors 50, 52 act as a voltage divider while resistor 54 generates a current for application to the summing junction 46. The difference between the two currents through resistors 44, 54 is integrated by integrating circuit 56 which comprises resistor 58, capacitor 60 and operational amplifier 62. The value of the integrating circuit 56 components are selected to provide a one hundred millisecond RC time constant in response to a step change occurring at the input of the integrating circuit 56. Operational amplifier 62 outputs a volume control signal which is applied to photoresistor 32 in order to control the level or amplitude of the audio signal outputted by the VCA 28. The level of the audio signal depends upon the current through the light emitting diode (LED) of photoresistor 32. Resistor 64 is provided to limit the current through the LED to 3 milliamps. Photoresistor 32 and resistor 30 provide a variable attenuation of 0 db to 40 db. Since resistors 34, 36 and operational amplifier 38 result in a constant +20 db gain, the VCA 28 provides a variable +20 db to −20 db gain.

In addition to being fed back through photoresistor 32, the volume control signal is also applied to a volume summing circuit 68. Each of the volume regulating circuits 24 outputs a volume control signal to the volume summing circuit 68. As a consequence, there are n volume control signals inputted to this circuit. In one embodiment, the volume summing circuit 68 outputs a volume control restoring signal corresponding to the average level of the inputted volume control signals. In another embodiment, the volume summing circuit 68 outputs a volume control restoring signal corresponding to the peak level or greatest input of all of the n volume control signals. The volume summing circuit 68 provides a fixed gain of −6 db.

The outputs of the volume regulating circuits 24, defined as the modified volume audio signals, are applied to an audio sum circuit 70. This circuit outputs a single audio sum signal corresponding to the sum of the modified volume audio signals. The audio sum circuit 70 has a constant gain of a −6 db.

After the summing process, the generated audio sum signal is sent to a volume dynamics restoring circuit 72. As depicted in FIG. 2, this circuit includes operational amplifier 74 which receives the audio sum signal at its non-inverting terminal. The output of operational amplifier 74 is applied to the non-inverting terminal of operational amplifier 76. The feedback path of operational amplifier 76 includes a fixed resistor 78 and variable resistance photoresistor 80. Operational amplifier 74 together with resistor 82 provides a −14 db attenuation of the audio sum signal while capacitor 84 removes any DC signal offset and also contributes to a high pass filter arrangement.

At the same time the audio sum signal is applied to the volume dynamics restoring circuit 72, the volume control restoring signal from the volume summing circuit 68 is also sent thereto. The volume control restoring signal is inputted to the non-inverting terminal of operational amplifier 86, as illustrated in FIG. 2. The volume control restoring signal is attenuated in the order of −14 db and is transmitted to the feedback path of operational amplifier 76 through photoresistor 80. In contrast to the photoresistor 32 of the volume regulating circuit 24, the photoresistor 80 is connected to the feedback path of the operational amplifier 76, which receives the audio sum signal. This positioning enables the voltage controlled amplifier of the volume dynamics restoring circuit 72, namely, operational amplifier 76 and resistors 78, 90, 92 and photoresistor 80, to provide a variable gain of 0 db to +40 db. This variable gain plus a fixed −6 db gain through the audio sum circuit 70 and a fixed −14 db gain through operational amplifier 74 results in an overall gain of −20 db to +20 db. This gain is the inverse of the gain experienced in the volume regulating circuits 24 of +20 db to −20 db. As a consequence, the volume dynamics of the audio signals previously altered are restored in the audio sum signal by means of the volume dynamics restoring circuit 72. The volume dynamics restoring circuit 72 outputs a signal defined as the volume restored audio signal. The volume restored audio signal is applied to a balance driver or balanced line driver 94 for minimizing hum over a transmission line. The balanced line driver output is normally applied to power amplifying units which feed audio speakers for generating sound using the volume restored audio signal.

Referring back to FIG. 1 for a description of the operation of the automatic sound mixing apparatus, a sound produced by one of the vocalists or instrumentalists is received by one of the microphones 10. In one embodiment of the present invention, the apparatus mixes sounds received by three hundred twenty microphones. Each microphone 10 outputs an audio signal which is amplified in the pre-amplifier circuit 12 connected thereto. Each amplified audio signal is then sent to one of the volume regulating circuits 24. The output of each volume regulating circuit 24 is the modified volume audio signal. Each of the volume regulating circuits 24 alters the volume dynamics of the audio signal inputted thereto. In fact, by means of the reference level circuit 48, the volume regulating circuit 24 forces the audio signal outputted by the pre-amplifier circuit 12 to a fixed, predetermined level. By choosing different values of resistors 50, 52, 54, a different reference level signal is obtainable. Depending upon the magnitude of the reference level signal, the amplitude of the audio signal outputted by the VCA 28 is set to a fixed level. Conventional sound mixing systems do not force the individual input sounds to a predetermined amplitude. Noise reduction systems provide the capability of altering the inputted audio signals depending upon the amplitude thereof. However, the compressors of these noise reduction systems, for example, provide a filtering function wherein the pass band of the filter is variable. The volume regulating circuit 24 of the sound mixing apparatus described herein outputs the same amplitude or level of audio signal, regardless of the amplitude of the inputted audio signal. In the preferred embodiment, each of the reference level signals of the individual volume regulating circuits 24 has the same magnitude. As a consequence, the level or amplitude of each of the modified volume audio signals is the same. In such an embodiment, it is readily understood that a single, reference level circuit 48 could be provided with the number of outputs therefrom corresponding to the number of microphones 10 or voltage controlled amplifiers 28. In an alternative embodiment, one or more of the reference level signals could have a magnitude different than the magnitude of the remaining reference level signals. This embodiment permits the sound mixing apparatus to emphasize or accentuate the sounds produced by one or more vocalists or instrumentalists.

Each volume regulating circuit 24 also generates a volume control signal. The amplitude of the volume control signal is a function of the amplitude of the modified volume audio signal outputted by the VCA 28 and the magnitude of the reference level signal. The volume control signal controls the output of the volume regulating circuit 24 to provide the fixed in level, predetermined modified volume audio signal. The volume control signal contains the volume dynamics information separated from the inputted audio signal in the volume regulating circuit 24. Each of the volume control signals generated by the plurality of volume regulating circuits 24 is transmitted to the volume summing circuit 68. The volume summing circuit 69 outputs a single volume control restoring signal. Each of the modified volume audio signals outputted by the volume regulating circuits 24 is applied to the audio sum circuit 70. The audio sum circuit 70 outputs a single, audio sum signal corresponding to the sum of each of the modified volume audio signals. The volume dynamics previously altered by the separation of each audio signal into a volume control signal and a modified volume audio signal in each volume regulating circuit 24 is restored in a collective manner in the volume dynamics restoring circuit 72. Rather than the volume dynamics of each audio signal from each of the microphones 10 being restored individually, the volume dynamics are restored in the audio sum signal by means of the volume control restoring signal. The volume dynamics restoring circuit 72 outputs the volume restored audio signal which is then applied to the balanced line driver 94. The balanced line driver output is delivered to power amplifiers, which are joined to speaker units for sound reproduction.

Figure 3:
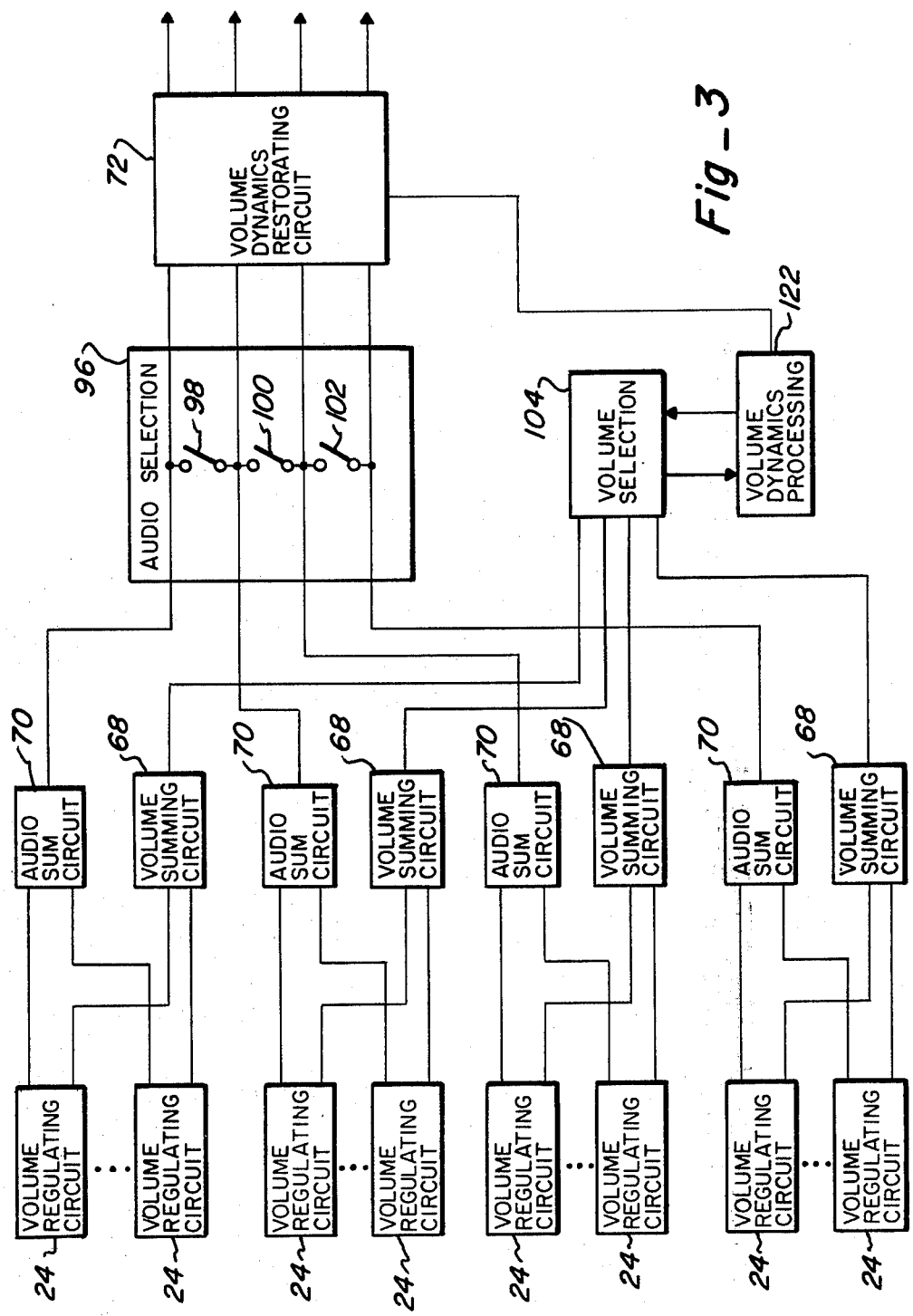
FIG. 3 is a block diagram of an alternative embodiment of the sound mixing apparatus.

Although the sound mixing apparatus has been so far described as outputting a signal audio signal from a relatively substantial number of musical sounds, the present invention can be adapted to simultaneously output a number of audio signals using any even greater number of inputted audio signals. This embodiment is advantageous, for example, when it is desirable to separately maintain sounds generated by soprano singers and bass singers. FIG. 3 illustrates in block diagram form such an apparatus. Just like the previously discussed embodiment, one microphone 10 communicates with one volume regulating circuit 24. Again, any number of microphones can be provided. The volume regulating circuits 24 can be divided into any number of groups. For such groups are represented in FIG. 3. As before, each volume regulating circuit 24 generates a modified volume audio signal and a volume control signal. The modified volume audio signals of each group are summed in an audio sum circuit 70. An average of the volume control signals of each group is obtained in a volume summing circuit 68. Each volume summing circuit 68 outputs a volume control restoring signal. As a consequence, a number of audio sum signals and a number of volume control restoring signals are produced, rather than a single audio sum signal and a single volume control restoring signal.

Figure 4:
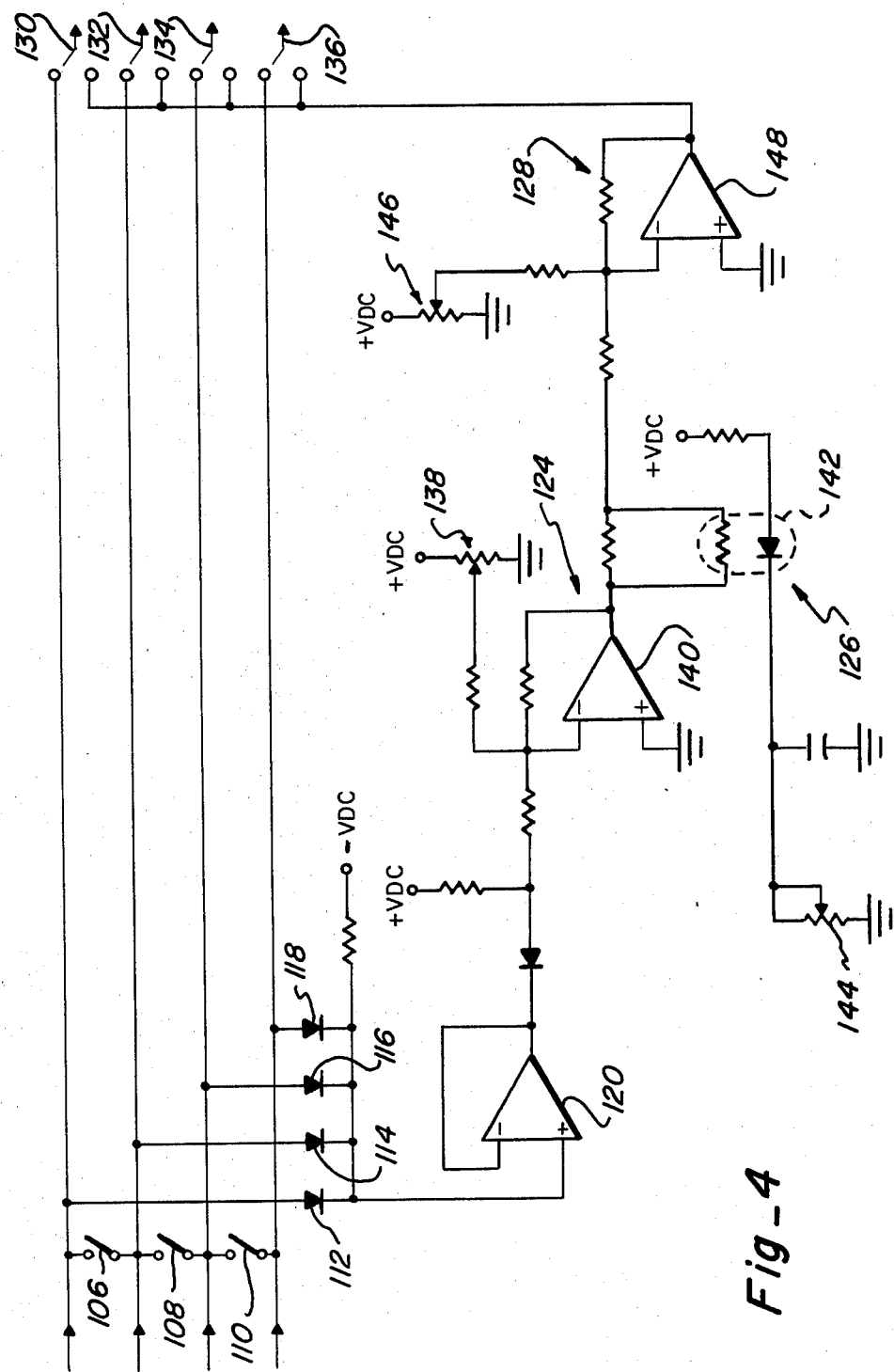
FIG. 4 is an electrical schematic showing details of the volume selection and volume dynamics processing circuits of the alternative embodiment.

Each of the audio sum signals is applied to an audio selection circuit 96. The audio selection circuit 96 includes three switches 98, 100, 102, as depicted in FIG. 3. The three switches 98, 100, 102 are provided for interconnecting the conducting lines carrying the four audio sum signals. Each of the volume control restoring signals is transmitted to a volume selection circuit 104. The electric schematic of the volume selection circuit 104 is shown in FIG. 4. The volume selection circuit 104 includes three input switches 106, 108, 110 for interconnecting the conducting lines carrying the four volume control restoring signals. The volume selection circuit 104 further includes four diodes 112, 114, 116, 118. The anode end of each of the diodes 112–118 receives one of the four volume control restoring signals. The cathode end of each of the four diodes 112–118 is joined to operational amplifier 120. The output of the volume selection circuit 104 is inputted to a volume dynamics processing circuit 122, as illustrated in FIG. 3. The volume dynamics processing circuit 122 is shown in FIG. 4 and includes a first shift circuit 124, a variable gain adjust circuit 126, and a second shift circuit 128. The output of the second shift circuit 128 is applied to a switching network comprising output switches 130, 132, 134, 136 in volume selection circuit 104. Each of the output switches 130–136 communicates with a volume dynamics restoring circuit 72.

When each of the input switches 106–110 are closed and at least one of the output switches 130–136 is in an "up" position so that the four conducting lines are interconnected to the volume dynamics restoring circuit 72, this embodiment operates in a similar manner as the previously described embodiment. That is to say, the four volume control restoring signals are combined to produce a single volume control restoring signal which is applied to the volume dynamics restoring circuit 72. However, when less than all three input switches 106–110 are closed and the appropriate output switches 130–136 are in a "down" position, the volume dynamics processing circuit 122 is utilized. For explanation purposes, assume input switches 106, 110 are in a closed position and output switches 130, 136 are in a "down" position while output switches 132, 134 remain in a "center" position. Since no direct path to the volume dynamics restoring circuit 72 is available, the four volume control restoring signals are delivered to the four diodes 112–118. Since the input switch 106 is closed, the volume control restoring signals carried by the interconnected conducting lines are combined. Similarly, the volume control restoring signals carried by the conducting lines interconnected by input switch 110 are combined. The greatest in amplitude of these two combined volume control restoring signals is outputted by the four diode network and applied to the operational amplifier 120. Hence, it is understood that whenever all three switches 106–110 is in an opened position, the volume selection circuit 104 outputs the largest in amplitude of the four volume control restoring signals. When one or two of the input switches 106–110 is in an opened position, the volume selection circuit 104 combines two or three of the volume control restoring signals before selecting the largest in amplitude of the combined volume control restoring signals. The selected volume control restoring signal outputted by operational amplifier 120 is applied to the first shift circuit 124. The first shift circuit 124 includes an amplitude shift network 138 which biases the selected volume control restoring signal so that the magnitude of the selected volume control restoring signal at one end or limit of its amplitude range is zero volts. The first shift circuit 124 also includes an operational amplifier 140 which inverts the inputted signal. The biased and inverted selected volume control restoring signal is then applied to the variable gain adjust circuit 126 which includes photoresistor 142. The gain of the selected volume control restoring signal is varied according to the current through photoresistor 142. The current through the photoresistor 142 is altered by adjustment of potentiometer 144. The variable gain has a range between a factor of two-thirds and a factor of two. The output of the variable gain adjust circuit 126 is applied to a second shift circuit 128 having an amplitude shift network 146 for removing the biasing added by the first shift circuit 124. The second shift circuit 128 also includes operational amplifier 148 which reinverts the inputted selected volume control restoring signal.

The volume dynamics processing circuit 122 enables the operator of the mixing apparatus to adjust the dynamics of the volume restoring signal to compensate for a lack of inputted audio signals. The mixing apparatus is devised for a predetermined and substantial number of audio signals. If each of the volume regulating circuits 24 does not receive an audio signal, the dynamics of the outputted audio signals suffers since the level of the volume control restoring signal obtained by averaging is diminished due to a fewer number of inputted audio signals. It is understood that this problem can be avoided by matching the number of vocalists or instrumentalists to the number of volume regulating circuits 24 and the number of microphones 10. However, this solution is impractical inasmuch as the number of vocalists or instrumentalists cannot be predetermined with accuracy. In addition, the modifying of the mixing apparatus to accommodate the number of vocalists or instrumentalists then present is time-consuming and requires some technical skill.

The output of the variable gain change circuit 122 is then transmitted through switches 130, 136 of the volume selection circuit 104 so that two selected volume control restoring signals are provided, each of the same magnitude and a function of the amplitudes of the four volume control restoring signals originally inputted to the volume selection circuit 104. Each selected volume control restoring signal is applied to a volume dynamics restoring circuit 72. Two audio sum signals are also applied to volume dynamics restoring circuits 72. Two audio sum signals are provided to match the number of selected volume control restoring signals. Since switches 106–110 of the volume selection circuit 104 were closed, corresponding switches 98 and 102 are closed in the audio sum selection circuit 96. One selected volume control restoring signal and one audio sum signal generate a volume control restored signal in a volume dynamics restoring circuit 72. Similarly, the other selected volume control restoring signal and the other audio sum signal generate a second volume control restored signal in a volume dynamics restoring circuit 72 so that two separate volume dynamics restored signals are provided.

In addition to the present invention being used in conjunction with live performances by a large group of vocalists or instrumentalists, the sound mixing apparatus also has application in combination with a tape recording apparatus. The tape recorder interface is provided at the output of the volume regulating circuits 24. The volume control signal is recorded to improve the signal-to-noise performance and also increase the dynamic range of the tape recorder. Two alternative methods for encoding the modified volume audio signals and volume control signals onto the tape have been devised. In a first method, the volume control signal is encoded and then combined with the fixed level or modified volume audio signals and recorded on a single channel of the tape recorder. In a second method, the modified volume audio signals and volume control signals are recorded on separate channels of the tape recorder. During playback, utilizing either of these two methods, the modified volume audio signals and volume control signals are decoded and applied to the volume dynamics restoring circuit 72.

In view of the foregoing description, the present invention provides an apparatus and a method for automatically mixing a plurality of sounds after setting the audio signals generated by the sounds to a fixed, predetermined level. The apparatus boosts low level sounds produced by weak vocalists while suppressing high level sounds produced by strong vocalists thereby providing a relatively uniform, amplified sound from a large, diverse musical group. Similarly, the apparatus minimizes the sound masking capability of brass instruments to enable vocalists to be understood when both sounds are simultaneously produced. As a result, a proper balance between sounds produced by vocalists and sounds generated by instrumentalists is achieved. The sound mixing apparatus also is capable of masking monotone or off-pitch voices when the number of such voices is a small percentage of the total number of vocalists. The present invention minimizes the need for an acoustically proper facility when live performances are conducted by a large number of vocalists or instrumentalists. Further, the mixing apparatus forces each of the inputted audio signals to a fixed, predetermined level so that the signal dynamics generated by such a large musical group is extended and enhanced. The present invention can mix a plurality of audio signals, each having the same level, or provide a sound mix which accentuates certain vocalists or instrumentalists. The mixing apparatus also has application in recording studios where vocal back-up groups are required. The desired backup sound can be obtained by varying the magnitude of the reference level signal until the preferred sound mix is provided. In addition, the automatic sound mixing apparatus can be interfaced with a conventional tape recording system to achieve a wide dynamic range and an improved signal-to-noise ratio.

Although the present invention has been described with reference to a plurality of embodiments thereof, it is readily understood that other variations and modifications can be effected within the spirit and scope of this invention.

What is claimed is:

1. A sound mixing apparatus for use with a relatively substantial number of vocalists and/or instrumentalists, comprising:
a plurality of microphones, each of said microphones for receiving sound generated by one of the vocalists or instrumentalists;
a plurality of regulating means, each of said regulating means receiving an audio signal outputted by one of said microphones, each of said regulating means controlling the level of the audio signal inputted thereto and each outputting a modified audio signal, each modified audio signal having a constant level;
mixing means responsive to each of said regulating means wherein all modified audio signals are continuously inputted to said mixing means, said mixing means for combining each of the modified audio signals outputted by each of said regulating means; and
first means responsive to said mixing means for outputting a restored audio signal, the level of the restored audio signal being dependent upon the level of each of the audio signals inputted to said plurality of regulating means.

2. An apparatus, as claimed in claim 1, wherein:
each of said regulating means outputs a volume control signal for controlling the level of the audio signal inputted to said regulating means, the volume control signals being combined to provide a volume control restoring signal, the volume control restoring signal inputted to said first means for controlling the level of the audio signal.

3. An apparatus, as claimed in claim 1, wherein:
said plurality of said regulating means includes at least one reference means for outputting a reference level signal having a predetermined magnitude, the constant level of at least one of the modified audio signals depending upon the predetermined magnitude of the reference level signals.

4. An apparatus, as claimed in claim 1, wherein:
said mixing means includes a number of volume summing circuits, each of said volume summing circuits outputting a volume control restoring signal for controlling the level of one of a number of restored audio signals.

5. An apparatus, as claimed in claim 4, further including:
means responsive to said mixing means for selecting the greatest in amplitude of said number of volume control restoring signals, the greatest in amplitude volume control restoring signal being used for controlling the level of at least one restored audio signal.

6. An apparatus, as claimed in claim 4, further including:

means responsive to at least two of said volume summing circuits for combining at least two of the volume control restoring signals; and means responsive to said combining means for selecting the greatest in amplitude of said volume control restoring signals, including any combinations of said volume control restoring signals outputting by said volume summing circuits.

7. An automatic sound mixing apparatus for use with a relatively substantial number of vocalists and/or instrumentalists, comprising:

a plurality of regulating means, each of said regulating means receiving an audio signal outputted by one of a number of microphones, each of said regulating means generating a volume control signal for controlling the level of the audio signal inputted thereto and for outputting a modified volume audio signal, each modified volume audio signal having a constant level;

mixing means responsive to each of said regulating means wherein all modified volume audio signals are continuously inputted to said mixing means, said mixing means for combining each of the plurality of modified volume audio signals outputted by said plurality of said regulating means.

8. An apparatus, as claimed in claim 7, wherein: the volume control restoring signal represents the average level of the volume control signals outputted by each of said regulating means.

9. An apparatus, as claimed in claim 7, further including:

means responsive to said summing means for adjusting the level of the volume control restoring signal whenever the number of audio signals outputted by the microphones is less than the number of regulating means available in the automatic sound mixing apparatus.

10. An apparatus, as claimed in claim 7, wherein:

said mixing means sums the magnitudes of the audio signals inputted thereto from each of said regulating means.

11. An apparatus, as claimed in claim 7, wherein:

said plurality of regulating means includes at least one reference means for producing a predetermined, fixed reference level signal, the level of each of the modified volume audio signals outputted by each of said regulating means being dependent upon the magnitude of the reference level signal.

12. An apparatus, as claimed in claim 11, wherein:

each of said regulating means includes a reference means and the magnitude of the reference level signal provided by each of said reference means is substantially the same so that the level of the modified volume audio signals outputted by each of said regulating means is substantially the same.

13. An apparatus, as claimed in claim 11, wherein:

the level of the volume control signal generated by one of said regulating means depends upon the magnitude of the reference level signal and the level of the audio signal inputted to said one of said regulating means.

14. An automatic sound mixing apparatus for use with a relatively substantial number of vocalists and/or instrumentalists, comprising:

a plurality of microphones, each of said microphones for receiving sound generated by one of the vocalists or instrumentalists and outputting an audio signal;

a plurality of regulating means, each of said regulating means responsive to only a corresponding one of said microphones, each of said regulating means including:

detecting means for providing a peak audio signal, reference means for providing a predetermined, fixed reference level signal, first means responsive to said detecting means and said reference means for outputting a volume control signal, and second means responsive to the volume control signal and one of said microphones for outputting a modified volume audio signal, the level of the modified volume audio signal depending upon the magnitude of the reference level signal;

summing means responsive to each of the volume control signals outputted by each of said regulating means, said summing means outputting a volume control restoring signal;

mixing means responsive to each of said modified volume audio signals for outputting an audio sum signal; and restoring means responsive to said summing means and said mixing means for controlling the level of the audio sum signal, the level of the audio sum signal being dependent upon the level of the volume control restoring signal.

15. A method for combining sounds generated simultaneously by a relatively substantial number of vocalists and/or instrumentalists, comprising the steps of:

providing a number of microphones, the number of microphones corresponding to the number of vocalists and instrumentalists;

regulating the level of each of the audio signals being outputted by each of the microphones to generate modified audio signals, each modified audio signal having a constant level regardless of the magnitude of its corresponding audio signal;

mixing continuously all of the modified audio signals to produce a single audio signal after regulating the level of each of the audio signals outputted by the microphones; and restoring the dynamics to the single audio signal modified during the regulating of the audio signal levels.

16. A method for combining a number of audio signals, comprising the steps of:

providing a reference level signal having a fixed, predetermined level;

producing a number of audio signals;

generating a number of control signals;

regulating the level of the audio signals using the reference level signal to generate modified audio signals, each of the modified audio signals having a constant level regardless of the magnitude of its corresponding audio signal;

mixing the modified audio signals to produce a single audio signal;

processing each of the control signals to output a restoring signal; and controlling the level of the single audio signal using the restoring signal to restore the dynamics of the audio signals altered during the regulating of the audio signal levels.

17. A method for combining a number of audio signals, comprising the steps of:

generating a plurality of audio signals;

separating each of the audio signals into a first signal component and a second signal component, each of the first signal components having a constant level;

mixing continuously, regardless of the magnitude thereof, all of the first signal components to provide a single audio signal;

mixing each of the second signal components to provide a single control signal; and combining the single audio signal and the single control signal to restore collectively the dynamics of the audio signals modified during the separating of the audio signals into first and second signal components.

18. A method for combining a number of audio signals outputted by a plurality of microphones, comprising the steps of:

adjusting the level of each of the audio signals outputted by each of the microphones to a constant predetermined level regardless of the magnitude of the audio signals outputted by the microphones;

mixing continuously all of the audio signals after adjustment to provide a single, collective audio signal;

readjusting the level of the single, collective audio signal so that the volume dynamics of the collective audio signal reflects the volume dynamics of the individual audio signals outputted by the microphones.

* * * * *